United States Patent [19]
Cha et al.

[11] Patent Number: 5,638,331
[45] Date of Patent: Jun. 10, 1997

[54] BURN-IN TEST CIRCUIT AND METHOD IN SEMICONDUCTOR MEMORY DEVICE

[75] Inventors: Gi-Woon Cha; Jei-Hwan Yoo, both of Suwon, Rep. of Korea

[73] Assignee: Samsung Electronics Co., Ltd., Suwon, Rep. of Korea

[21] Appl. No.: 572,300

[22] Filed: Dec. 13, 1995

[30] Foreign Application Priority Data

Dec. 13, 1994 [KR] Rep. of Korea ............... 33914/1994

[51] Int. Cl.$^6$ ........................................... G11C 7/00
[52] U.S. Cl. ........................... 365/201; 365/230.06
[58] Field of Search ........................... 365/201, 230.06; 371/22.5

[56] References Cited

U.S. PATENT DOCUMENTS

| | | | |
|---|---|---|---|
| 5,381,373 | 1/1995 | Ohsawa | 365/201 |
| 5,452,253 | 9/1995 | Choi | 365/201 |

*Primary Examiner*—David C. Nelms
*Assistant Examiner*—Michael T. Tran
*Attorney, Agent, or Firm*—Cushman Darby & Cushman, IP Group of Pillsbury Madison & Sutro, L.L.P.

[57] ABSTRACT

Disclosed is a burn-in test circuit and method of a semiconductor memory device which is capable of applying a stress voltage simultaneously to a plurality of word lines and which is operative when the device is in either a wafer or package state. The disclosed burn-in test circuit and method includes the capability of fusably disabling burn-in test operations in the memory device once the burn-in test is completed. The burn-in test circuit includes a burn-in enable signal generator for receiving a predetermined timing of external signals by which the burn-in test is selected, and for generating a burn-in enable signal in response. A row address decoder, responsive to the burn-in enable signal, places the word lines of the device in a high-impedance state so that a word line stress input unit can simultaneously apply a stress voltage to the word lines to perform the burn-in test. Upon completion of the burn-in test, the burn-in enable signal generator fusably disables the burn-in enable signal. The burn-in test method includes writing background data to each of the memory cells, enabling a burn-in test according to a predetermined timing of external signals, placing memory word lines in a high-impedance state, applying a stress voltage to the word lines, and then fusably disabling the subsequent performance of the burn-in test.

27 Claims, 4 Drawing Sheets

BURN-IN TEST CIRCUIT AND METHOD IN SEMICONDUCTOR MEMORY DEVICE

BACKGROUND OF THE INVENTION

1. Field of the Invention

The present invention relates to a semiconductor memory device and, more particularly, to a burn-in test circuit and method of a semiconductor memory device which is capable of simultaneously applying a stress voltage to a plurality of word lines. The burn-in test circuit and method of the present invention is operative in both the wafer and package states of production, enabling the rapid detection and removal of defective devices in both phases.

2. Description of the Related Art

Once semiconductor memory devices are produced, a screening operation is performed to detect and remove defective devices to ensure the overall quality of the devices. In one such screening operation, a burn-in test is executed, which can involve both field acceleration and temperature acceleration. In a burn-in test commonly called a stress test, the device is operated in a state wherein the voltage and temperature are set much higher than the normal operating voltage and temperature of the device. Moreover, a stress voltage higher than that which frequently causes initial failure during normal operation is applied to the device during a short time period. As a result, a device in which a defect may not otherwise exist until the device's initial operation is instead detected beforehand and removed from production. This results in final products with improved reliability.

One of the burn-in circuits known in the conventional art is a wafer burn-in (hereinafter referred to as WBI) circuit such as that disclosed on pages 639-642 of "1993 IEEE" by Tohru Furuyama of Japan. This WBI circuit is illustrated in FIG. 1, which shows a DRAM (dynamic random access memory) wafer structure, wherein the DRAM contains a plurality of memory cells each having an access transistor 2 and a storage capacitor 4 which are disposed between a word line driver 6 and a sense amplifier 8. Sources of NMOS transistors 10 are respectively connected to a final terminal of each word line W/L1-W/Ln, and drains thereof are connected to an extra pad Vg. Gates of NMOS transistors 10 are connected to another extra pad Vstress and one plate of the storage capacitor 4 within the DRAM cell is connected to another extra pad Vpl. In the structure described above, the burn-in test is performed by applying the stress voltage to each word line via the extra pads. The burn-in stress time for a single word line is obtained by dividing the overall burn-in time by 4K, in the case of a 4K refresh product. When the above WBI is adopted in the DRAM, since the stress voltage is simultaneously applied to all of the selected word lines W/L, there exists an advantage that the overall burn-in time can be reduced.

However, since extra pads Vg, Vstress, and Vpl are not bonded when the device is packaged, the burn-in test is limited to being performed only when the device is in the wafer state. Accordingly, the burn-in test can not be performed when the device is in the package state. Furthermore, with this burn-in test, the need to prevent the burn-in test from being executed by a user after the product is manufactured is not necessary, since the device can only be tested in the wafer state. Due to these problems, the fabricating process must be restrained due to the need to perform the burn-in test when the device is in the wafer state and, furthermore, performance of the burn-in test during a shorter span of time has not been possible.

SUMMARY OF THE INVENTION

Accordingly, an object of the present invention is to provide a burn-in test circuit which is free of the problems mentioned above.

Another object of the present invention is to provide a burn-in test circuit and method which is capable of simultaneously performing a burn-in test for a plurality of word lines in a memory device irrespective of whether the device is in a wafer or package state of the memory production process.

Another object of the present invention is to provide a burn-in test circuit of a semiconductor memory device which is capable of applying a stress voltage to all of the word lines at a rapid speed, when a screening operation is performed for removing defective memory devices.

Another object of the present invention is to provide a method which is capable of activating a semiconductor memory device having a burn-in time shortening circuit for improving device reliability and package yield.

Another object of the present invention is to provide a method and circuit which is capable of reducing a burn-in test time in wafer and package states.

Another object of the present invention is to provide a burn-in test circuit and method which is capable of performing a burn-in test by applying to word lines external signals having a specific timing through package external pins, and preventing a test operation from thereafter being executed again under the specific timing, after the burn-in test is completed.

According to one aspect of the present invention, a burn-in test circuit of a semiconductor memory device includes a burn-in enable signal generator for receiving a predetermined timing of external signals by which the burn-in test is selected, and for generating a burn-in enable signal in response. A row address decoder, responsive to the burn-in enable signal, places the word lines of the device in a high-impedance state so that a word line stress input unit can simultaneously apply a stress voltage to the word lines to perform the burn-in test. Upon completion of the burn-in test, the burn-in enable signal generator fusably disables the burn-in enable signal.

According to another aspect of the present invention, a burn-in test method of a semiconductor memory device includes writing background data to each of the memory cells, enabling a burn-in test according to a predetermined timing of external signals, placing the memory word lines in a high-impedance state, applying a stress voltage to the word lines, and then fusably disabling the subsequent performance of the burn-in test.

BRIEF DESCRIPTION OF THE DRAWINGS

This invention may be better understood and its object will become apparent to those skilled in the art by reference to the accompanying drawings wherein.

DESCRIPTION OF THE PREFERRED EMBODIMENTS

In the following description, a number of specific details are set forth in order to provide a thorough understanding of the present invention. It will be understood by those skilled in the art that other embodiments of the present invention may be practiced without these specific details, or with alternative specific details.

The term "burn-in test" as used herein refers to the operation of applying a stress voltage to word lines during the memory test, called "stress test" or "word line stress test." Further, the term "external signals" refers to signals applied through external pins exposed to the outside after the package process. These signals may be provided by a microprocessor, a specific signal generating unit, or a buffer.

Figure 1:
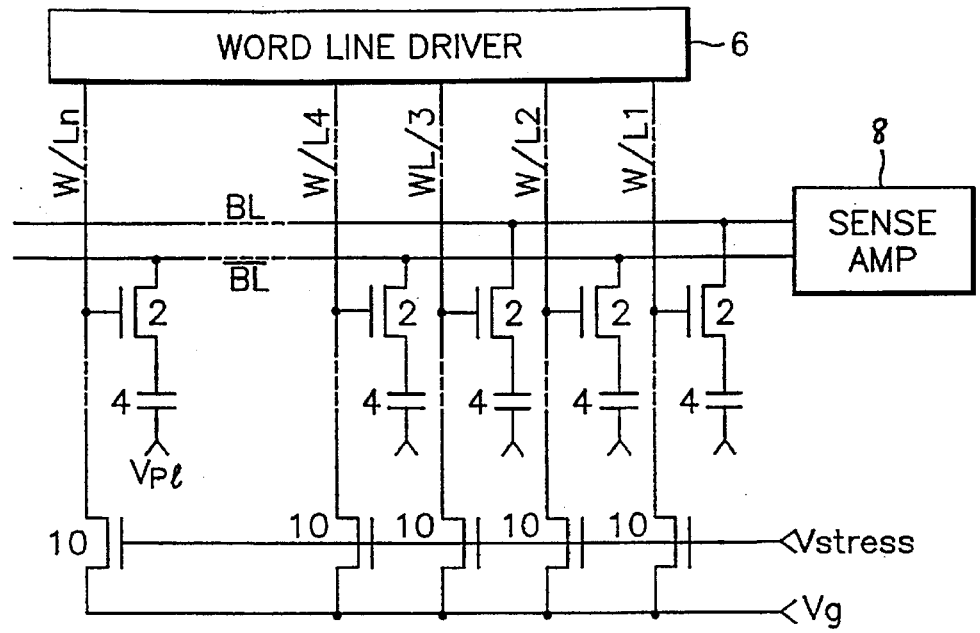
FIG. 1 is a circuit diagram showing the construction of a conventional wafer burn-in test.
Figure 2:
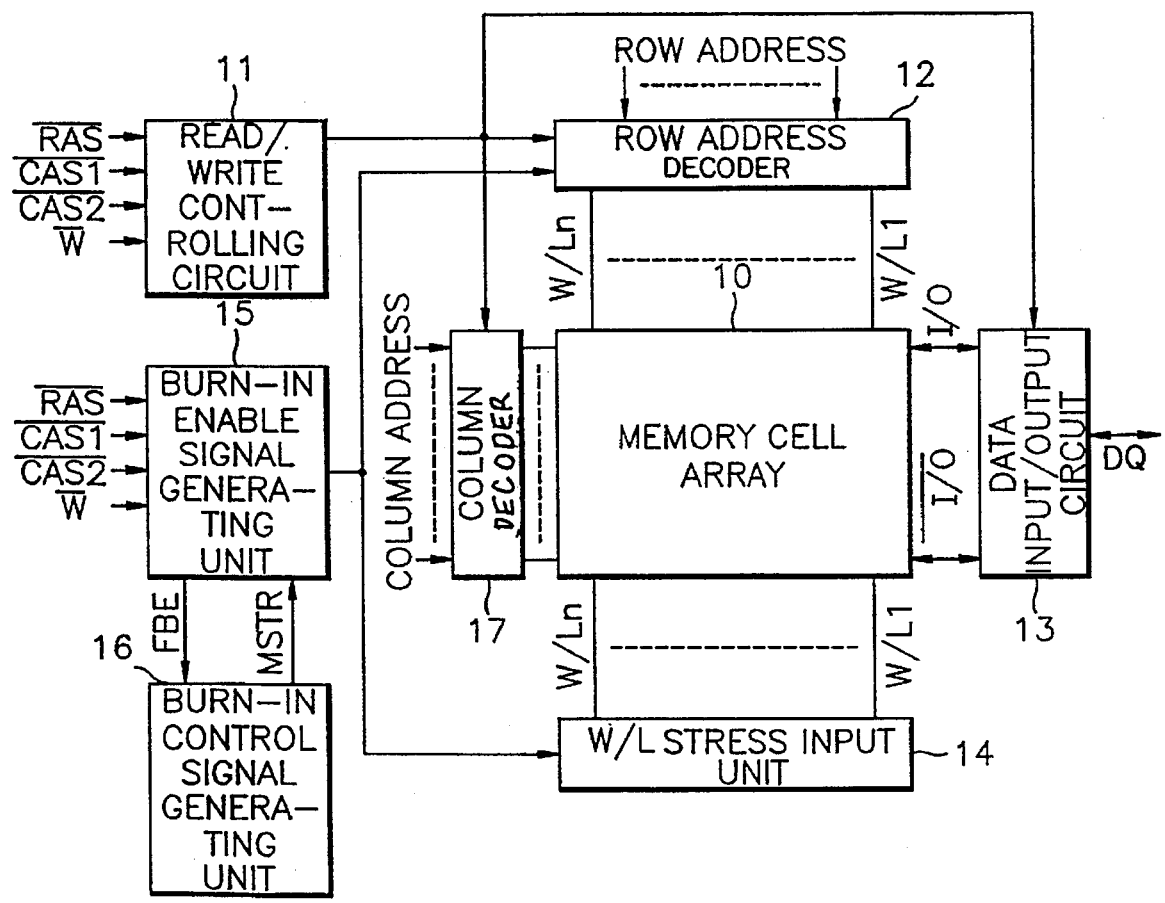
FIG. 2 is a block diagram showing the circuit of a semiconductor memory device, including a stress test circuit constructed according to the principles of the present invention.

FIG. 2 is a block diagram showing the circuit of a semiconductor memory device, including a stress test circuit constructed according to the principles of the present invention. In the figure, as well known by those skilled in the art, the dynamic memory is structured with a read/write control circuit 11 for controlling the data read/write operation, a row address decoder 12 for selecting a single word line among a plurality of word lines W/L1–W/Ln in response to a row address, a column decoder 17 for selecting a single bit line among a plurality of bit lines in response to a column address, and a memory cell array 10 having a plurality of memory cells being composed of a single access transistor and a single storage capacitor. Here, since the structure and operation of each of the units except for the row address decoder 12 and some of the external signals are well known in the art, the detailed explanation thereof will be avoided.

The stress test circuit according to the present invention further comprises a burn-in enable signal generating unit 15 for generating a burn-in enable signal and a fuse blowing signal in response to a predetermined timing of external signals, a burn-in control signal generating unit 16 for generating a burn-in control signal in response to the fuse blowing signal, and a word line stress input unit 14 for inputting a stress voltage applied through external pins of the memory to the word lines during the burn-in test, in response to the burn-in enable signal. The row address decoder 12 has a word line transfer transistor and a discharge transistor connected to each of the word lines, selects the word lines through the transfer transistor in response to the row address inputted upon a data input/output operation, and places the transfer transistor and the discharge transistor in a non-conductive state in response to the application of the burn-in enable signal, thereby maintaining the word lines in a floating state (high-impedance state) during the burn-in test.

Here, the stress voltage applied through the external pins of the memory is significantly higher than a normal memory operational voltage, which is desirably set to a potential of 6.5 through 7 volts. Since the stress voltage is applied from the external pins, it can be sufficiently adjustable, and if a prolonged period of time is desired, the applied voltage can be adjusted lower.

Meanwhile, the stress test in the present invention can be performed in both the wafer and package states. This is because the stress voltage is applied through the external pins, and the test is controlled by external input signals $\overline{RAS}$, $\overline{CAS1}$, $\overline{CAS2}$, and $\overline{W}$ which are applied to the burn-in enable signal generating unit 15 through the external pins of the memory as well. In other words, in the present invention, the burn-in enable signal generating signal 15 is determined by a specific timing condition of the external input signals to thereby control the burn-in test operation. Of the above external input signals, $\overline{RAS}$ is a row address strobe signal, $\overline{CAS1}$ is a first column address strobe signal, $\overline{CAS2}$ is a second column address strobe signal, and $\overline{W}$ is a write control signal. Here, the first and second column address strobe signals are supplied by the buffer circuit which logic-combines the external signals. The external signals have a timing diagram such as that shown in FIG. 4 during the stress test, and a timing diagram such as that shown in FIG. 5 after completion of the stress test. Hence, even though the specific timing condition to perform the stress test may be applied after the stress test has already been performed, the following burn-in test operation is permanently prevented by blowing an electrical fuse. This ensures stable operation of the memory by preventing the burn-in test from being executed by a user.

A burn-in test method embodied according to the present invention will be described with reference to FIG. 2. Background data is stored in all of the memory cells of the memory cell array 10 by the normal data write operation, and the burn-in enable signal is generated by the burn-in enable signal generating unit 15. Thereby, the word lines are set to the high-impedance state by the row address decoder 12. In this state, when the stress voltage applied through the external pins of the memory is inputted to the word lines by the word line stress input unit 14, the burn-in test is performed. After the completion of the burn-in test, the fuse of the burn-in control signal generating unit 16 is blown and the burn-in enable signal is thereafter permanently disabled.

An explanation of the structure and operation of each unit of FIG. 2 will be given hereinafter.

Figure 3:
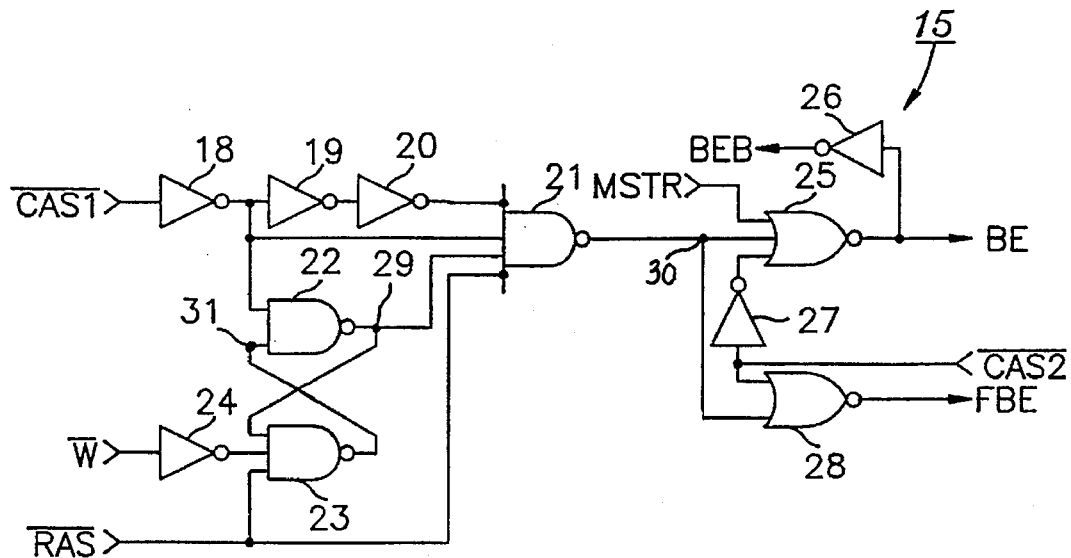
FIG. 3 is a detailed circuit diagram showing one construction of the burn-in enable signal generating unit 15 of FIG. 2.
Figure 4:
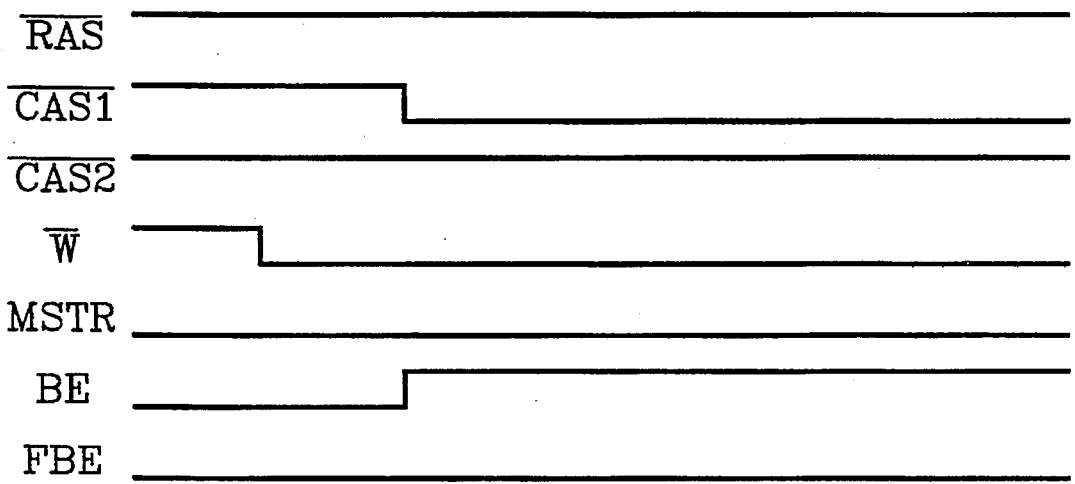
FIG. 4 is a timing diagram showing the relationship between the external signals for performing the stress test according to the present invention and the signals generated in each unit of FIG. 2.
Figure 5:
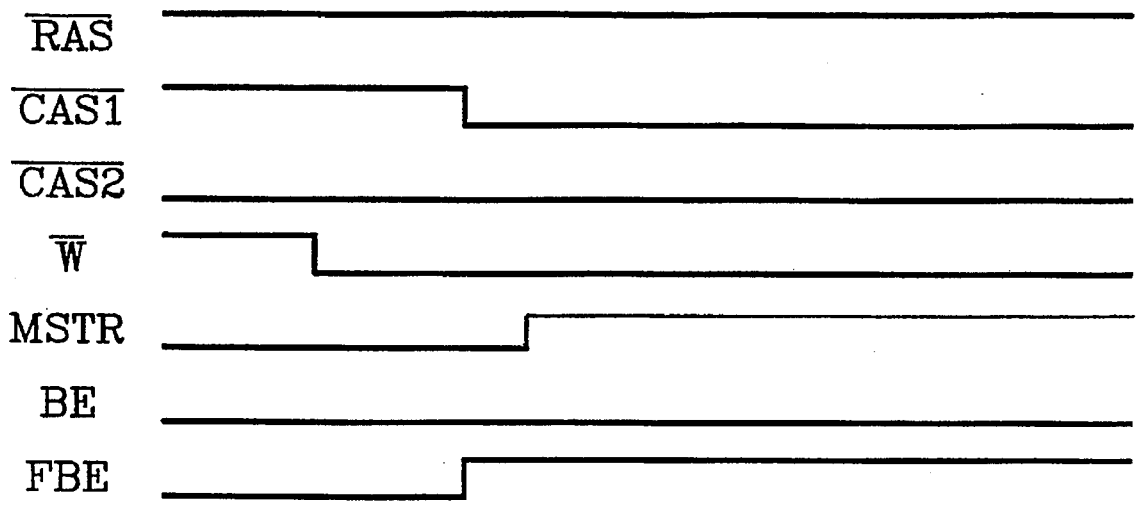
FIG. 5 is a timing diagram showing the relationship between the external signals after the completion of the stress test according to the present invention and the signals generated in each unit of FIG. 2.

FIG. 3 is a detailed circuit diagram showing the construction of the burn-in enable signal generating unit 15 of FIG. 2. FIG. 3 is clearly understood by referring to the timing diagram of FIG. 4 showing the relationship between the external signals during the stress test and the signals generated in each unit of FIG. 2 and the timing diagram of FIG. 5 showing the relationship between the external signals after completion of the stress test and the signals generated in each unit of FIG. 2. In FIG. 3, the first column address strobe signal $\overline{CAS1}$ is inputted to an inverter 18, the output of the inverter 18 is inputted to an inverter 19, and the output of the inverter 19 is inputted to an inverter 20. The write control signal $\overline{W}$ is inputted to an inverter 24. The output of the inverter 18 is inputted to one input of a 2-input NAND gate 22, and a connection node 31 is inputted to the other input of the 2-input NAND gate 22. A connection node 29, the output of the inverter 24, and the signal $\overline{RAS}$ are respectively inputted to a 3-input NAND gate 23, an output of which is connected to the connection node 31. Here, the 2-input and 3-input NAND gates 22 and 23 comprise a latch circuit structure. The outputs of the inverters 20 and 18, the connection node 29, and the signal $\overline{RAS}$ are respectively inputted to a 4-input NAND gate 21, an output of which is connected to a connection node 30. The signal $\overline{CAS2}$ is inputted to an inverter 27, and the output of inverter 27, a burn-in control signal MSTR (as will be described), and the connection node 30 are respectively inputted to a 3-input NOR gate 25. The output of the 3-input NOR gate 25 is the burn-in enable signal BE. Another burn-in enable signal BEB is the output of an inverter 26 inputting and then inverting the burn-in enable signal BE. It is of course appreciated that the signals BE and BEB are generated to have an opposite logic state to each other, and are referred to as the first and second burn-in enable signals in the preferred embodiment of the present invention. However, when referred to only as the burn-in enable signal, the first burn-in enable signal is usually indicated, though the second burn-in enable signal may also be included.

The fuse blowing enable signal FBE is the output of a 2-input NOR gate 28 inputting the signal $\overline{CAS2}$ and the connection node 30. The signal MSTR is called the burn-in control signal, and is output from the burn-in control signal generating unit 16, as will be discussed. If the electrical fuse within the generating unit 16 is blown, the signal MSTR is in a logic "H" (high) state, but if not, it is in a logic "L" (low) state. The fuse is manufactured in the polysilicon process without any additional process, and blown after the completion of the burn-in test. As a result, during the burn-in test, the signal MSTR is kept in the logic "L" state.

As shown in FIG. 4, when signals $\overline{RAS}$ and $\overline{CAS2}$ are each in the logic "H" state, if the signal $\overline{W}$ is changed from the logic "H" state to the logic "L" state and the signal $\overline{CAS1}$ is then changed from the logic "H" state to the logic "L" state (hereinafter referred to as "WBC1," meaning write enable before column address strobe timing or mode), the signal FBE is maintained to be in the logic "L" state, and the burn-in enable signal BE is enabled from the logic "L" state to the logic "H" state. If the external signals are satisfied with the WBC1 timing, the signal BE is generated from the logic "L" state to the logic "H" state, so as to perform the burn-in test. Referring to FIG. 5, after the completion of the test, if the WBC1 mode is executed when the signal $\overline{RAS}$ is in the logic "H" state and the signal $\overline{CAS2}$ is in the logic "L" state, the signal FBE is enabled from the logic "L" state to the logic "H" state. As a result, and discussed in further detail below, a fuse 41 of FIG. 6 is blown and the signal MSTR goes to the logic "H" state, thus preventing further execution of the burn-in test.

Figure 6:
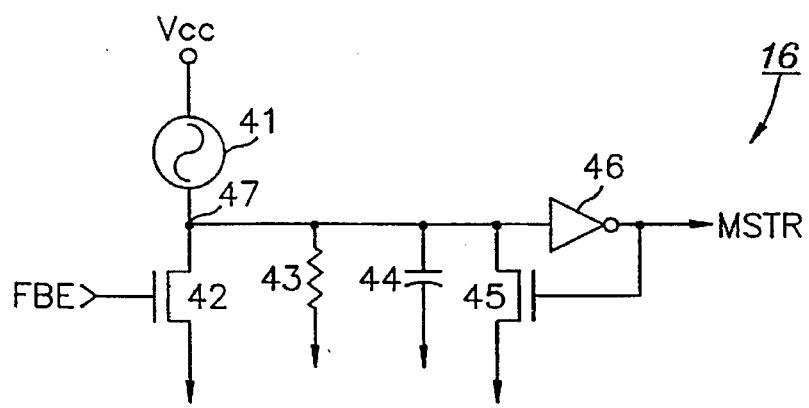
FIG. 6 is a detailed circuit diagram showing one construction of the burn-in control signal generating unit 16 of FIG. 2.
Figure 7:
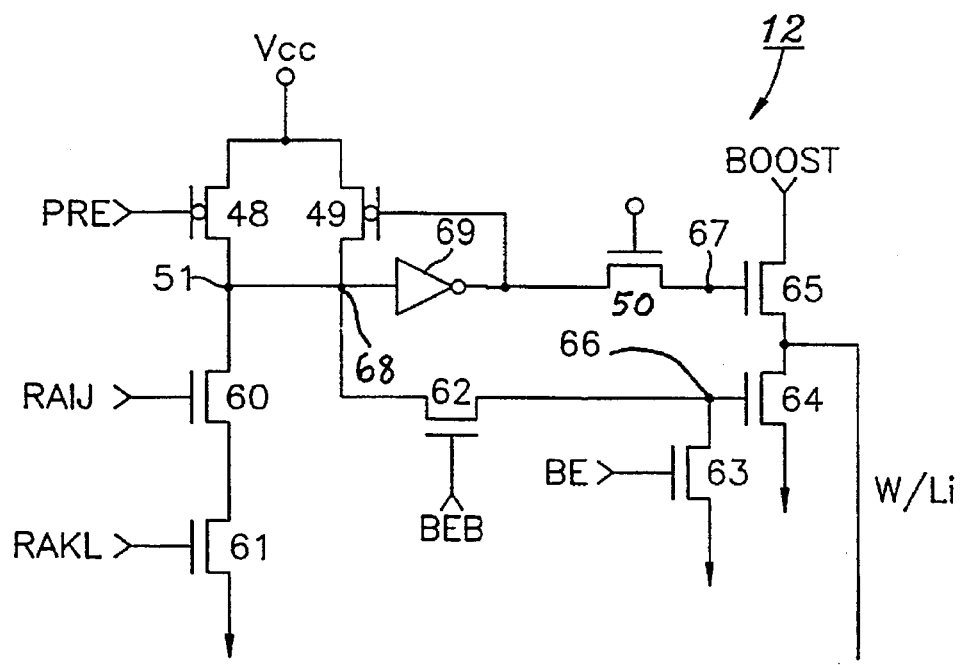
FIG. 7 is a detailed circuit diagram showing one construction of the row address decoder 12 of FIG. 2.
Figure 8:
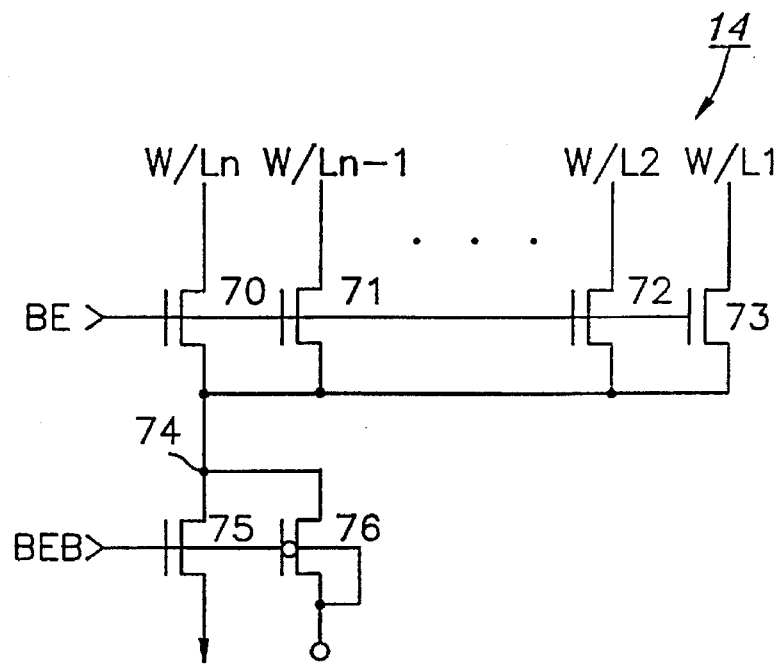
FIG. 8 is a detailed circuit diagram showing one construction of the word line stress input unit 14 of FIG. 2.
Figure 9:
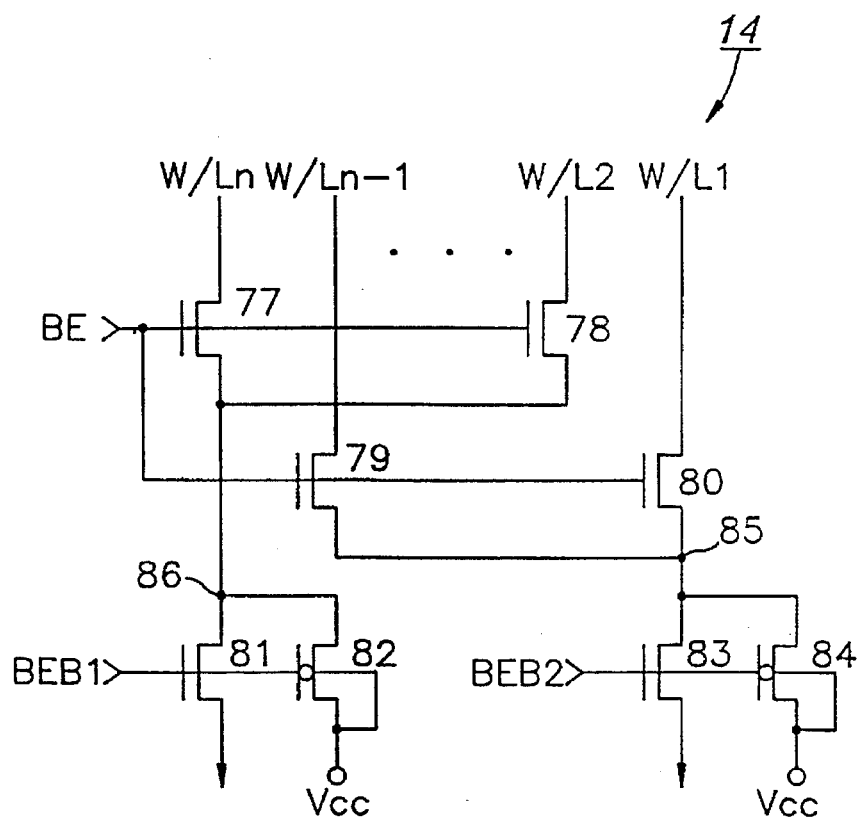
FIG. 9 is a detailed circuit diagram showing one another construction of the word line stress input unit 14 of FIG. 2.

FIG. 6 is a detailed circuit diagram showing one construction of the burn-in control signal generating unit 16 of FIG. 2. FIG. 7 is a detailed circuit diagram showing one construction of the row address decoder 12 of FIG. 2. FIG. 8 is a detailed circuit diagram showing one construction of the word line stress input unit 14 of FIG. 2. FIG. 9 is a detailed circuit diagram showing another construction of the word line stress input unit 14 of FIG. 2.

As shown in FIG. 6, the burn-in control signal generating unit 16 comprises the electrical cuttable fuse 41. The fuse 41 is blown when a current exceeding a predetermined reference value is flowed therethrough, as is well known in this field. One terminal of the fuse 41 is connected to a power supply source Vcc and the other terminal thereof is connected to a connection node 47. The power supply source Vcc and all of the Vcc denoted hereinafter are set to have 6.5 through 7 volts during the burn-in test, as applied through the external power pins. The drain of an NMOS transistor 42 is connected to the connection node 47, the source thereof is connected to ground GND, and the gate thereof is applied to the signal FBE. The input of an inverter 46 is connected to the connection node 47 and the output thereof is the burn-in control signal MSTR. Furthermore, the output of the inverter 46 is connected to the gate of an NMOS transistor 45, the ground potential GND is connected to the source of the transistor 45, and the connection node 47 is connected to the drain of the transistor 45. The inverter 46 and the NMOS transistor 45 have a latch circuit structure. Between the connection node 47 and the ground potential is connected a resistor 43 having a relatively large resistance value and a capacitor 44, both of which are arranged to insure stable operation of the circuit once the fuse 41 is blown or when applying the power supply voltage Vcc. Until the burn-in test is terminated, if the burn-in enable signal generating unit 15 does not enable the fuse blowing enable signal FBE to the logic "H" state, the fuse 41 is not blown, and the burn-in control signal MSTR is kept in the logic "L" state.

When the signal MSTR is in the logic "L" state and the signal $\overline{CAS2}$ is in the logic "H" state as shown in FIG. 4, if the WBC1 timing is executed, the burn-in enable signal BE of FIG. 3 is enabled to the logic "H" state, thereby performing the burn-in test. After completion of the test, the signal $\overline{CAS2}$ is in the logic "L" state as shown in FIG. 5, and if the WBC1 timing is thereafter executed, the signal FBE of FIG. 3 is enabled to the logic "H" state, thereby turning on NMOS transistor 42 of FIG. 6. Accordingly, the fuse 41 is blown due to the excessive current. After the fuse 41 has been blown, the signal MSTR is kept in the logic "H" state. Therefore, even when the user of the device attempts to establish the WBC1 timing condition, the stress test will not performed.

As shown in FIG. 7, a PMOS transistor 48 is a precharge transistor, whose source is connected to Vcc, drain to a connection node 51, and gate to a signal PRE. Signal PRE is a precharge signal of the row address decoder 12. The source of NMOS transistor 60 is connected to the drain of NMOS transistor 61 by a common node. Address input terminals RAIJ and RAKL supplying row address information are respectively connected to the gates of transistors 60 and 61. The drain of the transistor 60 is connected to the connection node 51 and the source of the transistor 61 is connected to the ground potential GND. Connection node 68 is inputted to inverter (or INV) 69. The above discussed connection nodes 51 and 68 are commonly connected. The power supply source Vcc is connected to the source of PMOS transistor 49, the connection node 68 to the drain thereof, and the output of inverter INV 69 to the gate thereof. Inverter 69 and transistor 49 have a latch circuit structure. The output of inverter INV 69 is connected to the source of NMOS transistor 50, connection node 67 to the drain thereof, and the power supply source Vcc to the gate thereof. Connection node 68 is connected to the source of an NMOS transistor 62, the connection node 66 to the drain thereof, and the signal BEB to the gate thereof. The ground potential GND is connected to the source of an NMOS transistor 63, connection node 66 to the drain thereof, and signal BE to the gate thereof. NMOS transistor 65 is the W/L transfer transistor, having a source connected to a voltage BOOST, drain to the word line W/Li, and gate to connection node 67. NMOS transistor 64 is the W/L discharge transistor, and has its source connected to the ground potential GND, drain to the word line W/L, and gate to connection node 66.

When the memory device is in a stand-by state, the precharge signal PRE and the address information are in the logic "L" state, and connection nodes 68 and 67 are in the logic "H" and "L" states, respectively. Meanwhile, having both a normal read/write operation and a stand-by state, the signals BEB and BE are in the logic "H" and "L" states, respectively, so that connection node 66 is in the logic "H" state during the stand-by state, thus maintaining the word line in the logic "L" state. Signal PRE is changed to the logic "H" state upon execution of a normal read/write operation, and the decoder having the row address information enables signals RAIJ and RAKL in the logic "H" state, connection node 68 to the logic "L" state. Accordingly, connection node 66 is changed to the logic "L" state, and connection node 67 is changed to the logic "H" state. Thereafter, when the high voltage is applied to the voltage BOOST, the corresponding word line W/Li is enabled to perform the read/write operation. However, since the signals PRE and BEB are in the logic "L" state and the signal BE is in the logic "H" state during burn-in test mode, the connection nodes 67 and 66 are all in the logic "L" state. As one of the features of the present invention, in the burn-in test mode, W/L transfer transistor 65 and W/L discharge transistor 64 are turned OFF, thus maintaining all of the word lines in a floating state. However, the logic states of connection nodes 66 and 67 can of course be adjusted according to the types of the W/L transfer transistor 65 and the W/L discharge transistor 64.

As shown in FIG. 8, NMOS transistors 70, 71, 72 and the drain of NMOS transistor 73 are each connected to a respective one of the word lines, and the gates of the NMOS transistors 70-73 are connected in common to the signal BE. The source, drain and gate of NMOS transistor 75 are connected to the ground potential GND, connection node 74 and the signal BEB, respectively. The source, drain and gate of PMOS transistor 76 are connected to the power supply source Vcc, connection node 74 and the signal BEB, respectively. As discussed above, in both states of the normal read/write operation and stand-by, the signals BE and BEB are in the logic "L" and "H" states, respectively; therefore, the NMOS transistors 70-73 and the PMOS transistor 76 are turned OFF and NMOS transistor 75 is turned ON. Hence, the word line enable is made by means of the NMOS transistor 65 of FIG. 7. On the other hand, during the burn-in test mode, the signals BE and BEB are in the logic "H" and "L" states, respectively; accordingly, in this state, the NMOS transistors 70-73 and PMOS transistor 76 are turned ON and the NMOS transistor 75 is turned OFF. Hence, the burn-in test is at once performed by supplying a voltage to the word lines. NMOS transistors 70-73 are the transfer transistors for supplying the charge to each of the word lines, and PMOS transistor 76 acts as a current source for supplying the charge to the word lines. NMOS transistor 75 is provided to remove a leakage current generated in the NMOS transistors 70-73 during both the normal operation and the stand-by state.

FIG. 9 shows another embodiment of the word line stress input unit 14, in which is provided is a method for a bridge check of the word lines. Drains of NMOS transistors 77-80 are connected to the end of the word lines, respectively, and the signal BE is connected in common to each of the gates of NMOS transistors 77-80. Connection node 86 is connected to the sources of odd-positioned transistors, and connection node 85 is connected to the sources of even-positioned transistors. Connection node 85 is further connected to the drains of NMOS transistor 83 and PMOS transistor 84. The ground GND and the power supply voltage Vcc are connected to the respective sources and signal BEB2 is connected to the gates of both transistors 53 and 54. In this case, since either the word line disposed in the even position is in the logic "H" state when the word line disposed in the odd position is in the logic "L" state or all of the word lines are enabled to the logic "H" state, it is possible to perform the bridge check of the word lines. After the back-ground data is written and before advancing to the burn-in test, if the burn-in test mode is enabled, the cell stress and bit line stress can be applied. As a result, all of the defects in the memory cell can be effectively checked within a short time period.

As apparent from the foregoing, there is provided a burn-in test circuit and method according to the present invention which is capable of simultaneously performing a burn-in test for a plurality of word lines irrespective of whether the memory device is in a wafer or package state of the production process. Further, there is provided a burn-in test circuit of the semiconductor memory which is capable of applying a stress voltage to all of the word lines at a rapid speed, when performing a screening operation for removing defective memory devices. Moreover, there is provided a method which is capable of activating a semiconductor memory device having a burn-in time shortening circuit for improving device reliability device and package yield.

The present invention is not limited to the above-described embodiments. For example, the stress voltage can be applied to the plurality of word lines through the transfer transistor and word line discharge transistor without having any word line stress input unit.

While the present invention has been described with respect to what is presently considered to be the preferred embodiments, it is to be understood that the invention is not limited to the embodiments herein disclosed. The present invention is intended to cover various modifications and equivalent arrangements included within the spirit and scope of the appended claims.

What is claimed is:

1. A semiconductor memory device comprising:

a memory cell array;

a plurality of word lines connected to said memory cell array;

a burn-in enable signal generator responsive to a first state of external signals for generating a burn-in enable signal;

a burn-in control signal generator responsive to a second state of said external signals, said burn-in control signal generator preventing said burn-in enable signal generator from generating said burn-in enable signal; and a word line stress voltage input circuit for applying a stress voltage to said plurality of word lines, to thus perform a burn-in test.

2. A semiconductor memory device according to claim 1, wherein said burn-in control signal generator includes a fuse, said fuse being blown in response to said second state of said external signals, said burn-in control signal generator thereafter preventing said burn-in enable signal generator from generating said burn-in enable signal.

3. A semiconductor memory device according to claim 1, wherein said word line stress voltage input circuit is responsive to said burn-in enable signal.

4. A semiconductor memory device according to claim 1, further comprising a row address decoder responsive to said burn-in enable signal for maintaining said plurality of word lines in a high-impedance state during said burn-in test.

5. A semiconductor memory device comprising:

a plurality of memory cells;

a plurality of word lines connected to respective ones of said memory cells; and a burn-in test circuit having a burn-in signal generator for generating a burn-in enable signal to enable a burn-in test to be performed in said semiconductor memory device in response to a predetermined timing of external signals, and for fusably disabling said burn-in enable signal after said burn-in test is completed, a word line stress voltage input circuit connected to said plurality of word lines, said word line stress voltage input circuit supplying a stress voltage to said plurality of word lines in response to the burn-in enable signal, said stress voltage being applied to said memory device from an external source during said burn-in test.

6. The semiconductor memory device according to claim 5, further comprising a row address decoder connected to said plurality of word lines, said row address decoder enabling a burn-in operation to be performed on said plurality of word lines in response to said burn-in enable signal, said row address decoder enabling a normal data operation to be performed on a selected one of said plurality of word lines in correspondence with a row address received from said external source.

7. The semiconductor memory device according to claim 6, wherein said row address decoder includes a plurality of transfer transistors, each of which is connected to a respective one of said plurality of word lines, and a plurality of discharge transistors, each of which is connected to a respective one of said plurality of word lines, each of said plurality of word line transfer transistors and said plurality of discharge transistors being in a non-conductive state during said burn-in operation.

8. The semiconductor memory device according to claim 5, wherein said predetermined timing is a write enable before column address strobe (WBC) mode.

9. The semiconductor memory device according to claim 5, wherein said burn-in signal generator includes:

a burn-in enable signal generator for generating said burn-in enable signal and a fuse blowing signal in response to said predetermined timing of external signals; and a burn-in control signal generator having an electrical fuse therein, said electrical fuse being blown in response to said fuse blowing signal, said burn-in control signal generator thereafter preventing generation of said burn-in enable signal.

10. The semiconductor memory device according to claim 5, wherein said semiconductor memory device is a dynamic memory, each of said plurality of memory cells having an access transistor and a storage capacitor, and each of said plurality of word lines being connected to a gate of said access transistor of said respective ones of said memory cells.

11. A burn-in test method of a semiconductor memory device, comprising the steps of:

storing burn-in test data within a plurality of memory cells before a burn-in test;

receiving external signals having a predetermined timing;

maintaining a plurality of word lines in a high-impedance state in response to said predetermined timing;

performing said burn-in test by applying a stress voltage to said plurality of word lines; and fusably disabling a circuit element to prevent said burn-in test from being repeated after said burn-in test is completed.

12. The burn-in test method according to claim 11, wherein said step of receiving said external signals includes the step of generating a burn-in enable signal in response to receipt of said external signals having said predetermined timing.

13. A semiconductor device comprising:

a memory array;

a plurality of word lines connected to said memory array;

a burn-in enable signal generator for generating a burn-in enable signal in response to a first condition of external signals;

a burn-in control signal generator for generating a burn-in control signal in response to said external signals, said burn-in control signal having a first logic level in response to said first condition of said external signals and a second logic level in response to a second condition of said external signals, said burn-in enable signal generator being prevented from generating said burn-in enable signal when said burn-in control signal has said second logic level;

a word line stress voltage input circuit for applying a stress voltage to said plurality of word lines in response to said burn-in enable signal, said word line stress input unit being operative when said semiconductor device is in a wafer state and a package state.

14. The semiconductor device according to claim 13, further comprising a row address decoder connected to said plurality of word lines and responsive to said burn-in enable signal, said row address decoder having a plurality of transfer transistors and a plurality of discharge transistors, each of which is connected to a respective one of said plurality of word lines, said plurality of transfer transistors and said plurality of discharge transistors being turned off in response to said burn-in enable control signal.

15. The semiconductor device according to claim 14, wherein:

said row address decoder is further responsive to a precharge signal and a row address signal; and each of said plurality of discharge transistors includes:

a first gate connected to a drain of a first transistor, a drain connected to said respective one of said plurality of word lines, and a source connected to a discharge potential, a voltage level of said first gate of said discharge transistor being dependent on logic states of said row address signal and said precharge signal in a normal mode and being independent of said logic states of said row address signal and said precharge signal in a burn-in mode, each of said plurality of discharge transistors being turned on or off in accordance with said logic states of said row address signal and said precharge signal in said normal mode and turned off in said burn-in mode.

16. The semiconductor device according to claim 15, wherein said first transistor is a PMOS transistor.

17. The semiconductor device according to claim 15, wherein said first transistor is an NMOS transistor.

18. The semiconductor device according to claim 15, wherein each of said plurality of transfer transistors includes a second gate connected to a drain of a second transistor, a drain connected to said respective one of said plurality of word lines, and a source connected to a transfer potential, a voltage level of said second gate being dependent on said logic states of said row address signal and said precharge signal in said normal mode, and being independent of said logic states of the row address signal and said precharge signal in said burn-in mode, each of said transfer transistors being turned on or off in accordance with said logic states of said row address signal and said precharge signal in said normal mode and turned off in said burn-in mode.

19. The semiconductor device according to claim 18, wherein said second transistor is a PMOS transistor.

20. The semiconductor device according to claim 18, wherein said second transistor is an NMOS transistor.

21. The semiconductor device according to claim 13, wherein said burn-in enable signal generator includes a latch structure for latching said first condition of external signals.

22. The semiconductor device according to claim 13, wherein said burn-in control signal generator includes an electrical fuse, said burn-in control signal having one of said first and second logic levels dependent upon whether said electrical fuse is blown.

23. The semiconductor device according to claim 22, wherein said burn-in control signal generator includes a latch structure for latching said first or second logic level of said burn-in control signal.

24. The semiconductor device according to claim 13, wherein said word line stress input unit includes:
   a connection node;
   a plurality of transistors, each of which is connected between a terminal of a respective one of said plurality of word lines and said connection node, said plurality of transistors being turned on only in a burn-in mode,
   an NMOS transistor connected between said connection node and a ground voltage, and
   a PMOS transistor connected between said connection node and a power supply voltage, said plurality of word lines being enabled by turning on said PMOS transistor.

25. The semiconductor device according to claim 24, wherein said connection node is maintained to a logic low level in a normal mode and a stand-by mode.

26. The semiconductor device according to claim 13, wherein:
   said plurality of word lines are comprised of even-positioned word lines and odd-positioned word lines; and
   said word line stress input unit includes:
      a first connection node,
      a second connection node,
      a plurality of first transistors, each of which is connected between a terminal of a respective one of said odd-positioned word lines and said first connection node, said plurality of first transistors being turned on only in a burn-in mode,
      a plurality of second transistors, each of which is connected between a terminal of a respective one of said even-positioned word lines and said second connection node, said plurality of second transistors being turned on only in a burn-in mode,
      a first NMOS transistor connected between said first connection node and a ground voltage,
      a first PMOS transistor connected between said first connection node and a power supply voltage, said odd-positioned word lines being enabled by turning on said first PMOS transistor,
      a second NMOS transistor connected between said second connection node and said ground voltage, and
      a second PMOS transistor connected between said second connection node and said power supply voltage, said even-positioned word lines being enabled by turning on said second PMOS transistor.

27. A semiconductor memory device comprising:
   a plurality of memory cells each having an access transistor and a storage capacitor;
   a plurality of word lines connected to respective ones of said memory cells; and
   a burn-in test circuit having
      a burn-in signal generator for generating a burn-in enable signal in response to a predetermined timing of external signals, and for fusably disabling said burn-in enable signal after completion of a burn-in test,
      a row address decoder connected to said plurality of word lines, for selectively enabling one of said word lines in response to a row address during a normal data operation, and for placing said plurality of word lines in a high-impedance state in response to said burn-in enable signal, and
      a word line stress input unit for inputting a stress voltage applied through external pins of said memory device during said burn-in test in response to said burn-in enable signal, and for applying said stress voltage to said plurality of word lines.

* * * * *